United States Patent
Welty

(10) Patent No.: US 6,940,305 B2
(45) Date of Patent: Sep. 6, 2005

(54) LOW LEAKAGE IOFF AND OVERVOLTAGE IOZ CIRCUIT

(75) Inventor: Mark B. Welty, Denison, TX (US)

(73) Assignee: Texas Instruments Incorporated, Dallas, TX (US)

(*) Notice: Subject to any disclaimer, the term of this patent is extended or adjusted under 35 U.S.C. 154(b) by 103 days.

(21) Appl. No.: 10/704,410

(22) Filed: Nov. 7, 2003

(65) Prior Publication Data

US 2005/0099207 A1 May 12, 2005

(51) Int. Cl.[7] .................................. H03K 17/16
(52) U.S. Cl. ...................... 326/31; 326/58; 326/81
(58) Field of Search .................... 326/31, 33–34, 326/56–58, 80, 81

(56) References Cited

U.S. PATENT DOCUMENTS 5,450,025 A * 9/1995 Shay ........................... 326/81
5,546,021 A * 8/1996 Bizuneh et al. ............... 326/86
6,265,926 B1 * 7/2001 Wong ........................... 327/318

* cited by examiner

Primary Examiner—James H. Cho
(74) Attorney, Agent, or Firm—William B. Kempler; W. James Brady, III; Frederick J. Telecky, Jr.

(57) ABSTRACT

A blocking circuit technique achieves very low Ioff and Ioz leakage in low power digital logic devices that incorporate Ioff and overvoltage tolerance. The blocking circuit employs a diode-connected P-channel device in parallel with a PN diode. The diode-connected P-channel device provides enough forward leakage in the subthreshold region to keep Ioz through the upper output driver to a very low level (0.2 uA typical). Further, both the diode-connected P-channel device and the PN diode together provide enough reverse blocking capability to keep Ioff to a very low level (0.2 uA typical).

6 Claims, 2 Drawing Sheets

LOW LEAKAGE IOFF AND OVERVOLTAGE IOZ CIRCUIT

BACKGROUND OF THE INVENTION

1. Field of the Invention

This invention relates generally to low power digital logic devices, and more particularly to a technique for achieving very low Ioff and Ioz leakage in low power digital logic devices that incorporate Ioff and overvoltage tolerance.

2. Description of the Prior Art

Known Ioff/overvoltage blocking circuits use a PN diode in parallel with a Schottky diode and can not achieve very low leakage levels for both Ioff and Ioz. The inherent reverse leakage of a Schottky diode causes Ioff to be undesirably high for certain low power applications. A PN diode alone will not provide enough forward leakage to keep the upper output driver (UOP) fully turned off during Ioz conditions—resulting in Ioz values that are undesirably high.

In view of the foregoing, it would be both beneficial and advantageous to provide a technique for achieving very low Ioff and Ioz leakage in low power digital logic devices that incorporate Ioff and overvoltage tolerance.

SUMMARY OF THE INVENTION

To meet the above and other objectives, the present invention provides a technique for achieving very low Ioff and Ioz leakage in low power digital logic devices that incorporate Ioff and overvoltage tolerance. The technique employs a diode-connected P-channel device in parallel with a PN diode. The diode-connected P-channel device provides enough forward leakage in the subthreshold region to keep Ioz through the upper output driver to a very low level (0.2 uA typical). Further, both the diode-connected P-channel device and the PN diode together provide enough reverse blocking capability to keep Ioff to a very low level (0.2 uA typical).

As used herein, "Ioz" is defined as the current flowing into an output with the input conditions applied that establish the high-impedance state at the output. The current Ioz is important since a system may have several chips attached to the same bus. While one chip is driving the bus, others may be in tri-state (high-impedance state) such that they do not load down the bus. Any Ioz current on the tri-stated bus is wasted. Typical devices today spec Ioz at up to +/−10 uA. On a 32-bit bus, that would be 320 uA of wasted current.

As used herein, "Ioff" is defined as the maximum current into an input or output terminal of the device, with the specified voltage applied to the terminal and Vcc=0V. This is a similar test to that used for establishing Ioz, except the device is powered off. In some systems, to save power, multiple devices connected to a bus may be powered off while another device is driving the bus.

According to one embodiment, an overvoltage blocking circuit comprises a supply voltage node; a tri-state output circuit having an output node; and a protection circuit coupled to the supply voltage node and the tri-state output circuit and operable to limit current 'Ioz' flowing into the output node to less than 1 micro-Ampere when the tri-state output circuit is in its high impedance state, and further operable to limit the off leakage current 'Ioff' flowing into the output node to less than 1 micro-Ampere when the tri-state output circuit is powered-off.

According to another embodiment, an overvoltage blocking circuit comprises a supply voltage node; a tri-state output circuit coupled to the supply node and having an output node; and means for limiting high impedance state leakage current 'Ioz' flowing into the output node to less than 1 micro-Ampere when the tri-state output circuit is in its high impedance state, and further for limiting the off leakage current 'Ioff' flowing into the output node to less than 1 micro-Ampere when the tri-state output circuit is powered-off.

BRIEF DESCRIPTION OF THE DRAWINGS

Other aspects and features of the present invention and many of the attendant advantages of the present invention will be readily appreciated, as the invention becomes better understood by reference to the following detailed description when considered in connection with the accompanying drawing figures thereof and wherein.

While the above-identified drawing figures set forth a particular embodiment, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

As stated herein before, the present invention provides a technique for achieving very low Ioff and Ioz leakage in low power digital logic devices that incorporate Ioff and overvoltage tolerance. The technique employs a diode-connected P-channel device in parallel with a PN diode. The diode-connected P-channel device provides enough forward leakage in the subthreshold region to keep Ioz through the upper output driver to a very low level (0.2 uA typical). Further, both the diode-connected P-channel device and the PN diode together provide enough reverse blocking capability to keep Ioff to a very low level (0.2 uA typical).

Figure 1:
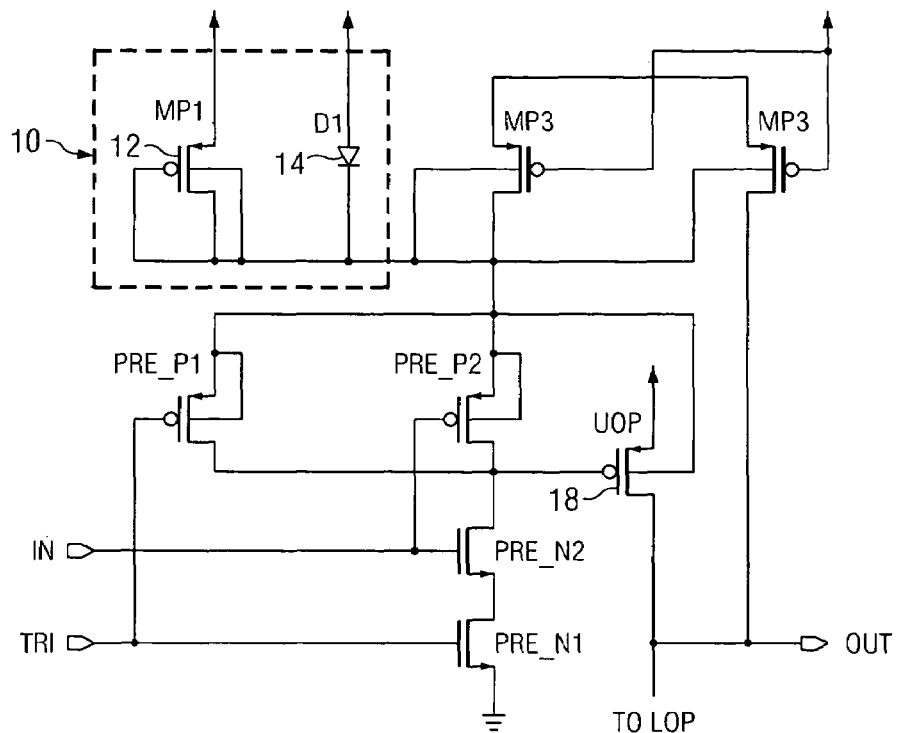
FIG. 1 is a schematic diagram illustrating a low leakage Ioff, Ioz overvoltage blocking circuit according to one embodiment of the present invention.

Looking now at FIG. 1, a schematic diagram illustrates a low leakage Ioff, Ioz overvoltage blocking circuit 10 according to one embodiment of the present invention. Blocking circuit 10 can be seen to have a diode-connected P-channel transistor 12 in parallel with a PN diode 14. FIG. 1 also depicts a partial tri-state output circuit 16 that operates in association with blocking circuit 10. As stated herein before, the diode-connected P-channel transistor 12 provides enough forward leakage in the subthreshold region to keep Ioz through the upper output driver 18 to a very low level such as discussed further herein below with reference to FIG. 3. Together, the diode-connected P-channel transistor 12 and the PN diode 14 provide enough reverse blocking capability to keep Ioff to a very low level such as discussed further herein below with reference to FIG. 2.

Figure 2:
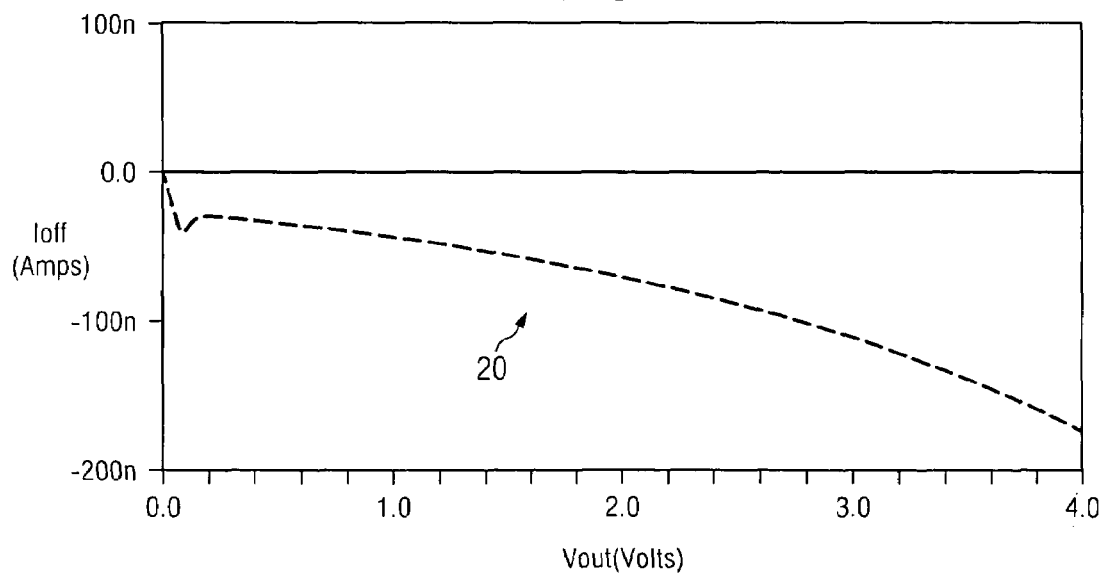
FIG. 2 is a graph depicting typical Ioff plots for the blocking circuit shown in FIG. 1.

FIG. 2 is a graph depicting a typical Ioff (leakage current) plot 20 for the blocking circuit 10 shown in FIG. 1. Leakage current plot 20 was obtained using a supply voltage, Vcc=0.0 volts, while the output voltage, Vout was varied between 0.0 volts and 4.0 volts. It can be easily seen that the leakage current, Ioff, remained less than 200 nano-Amperes everywhere in the sweep region.

Figure 3:
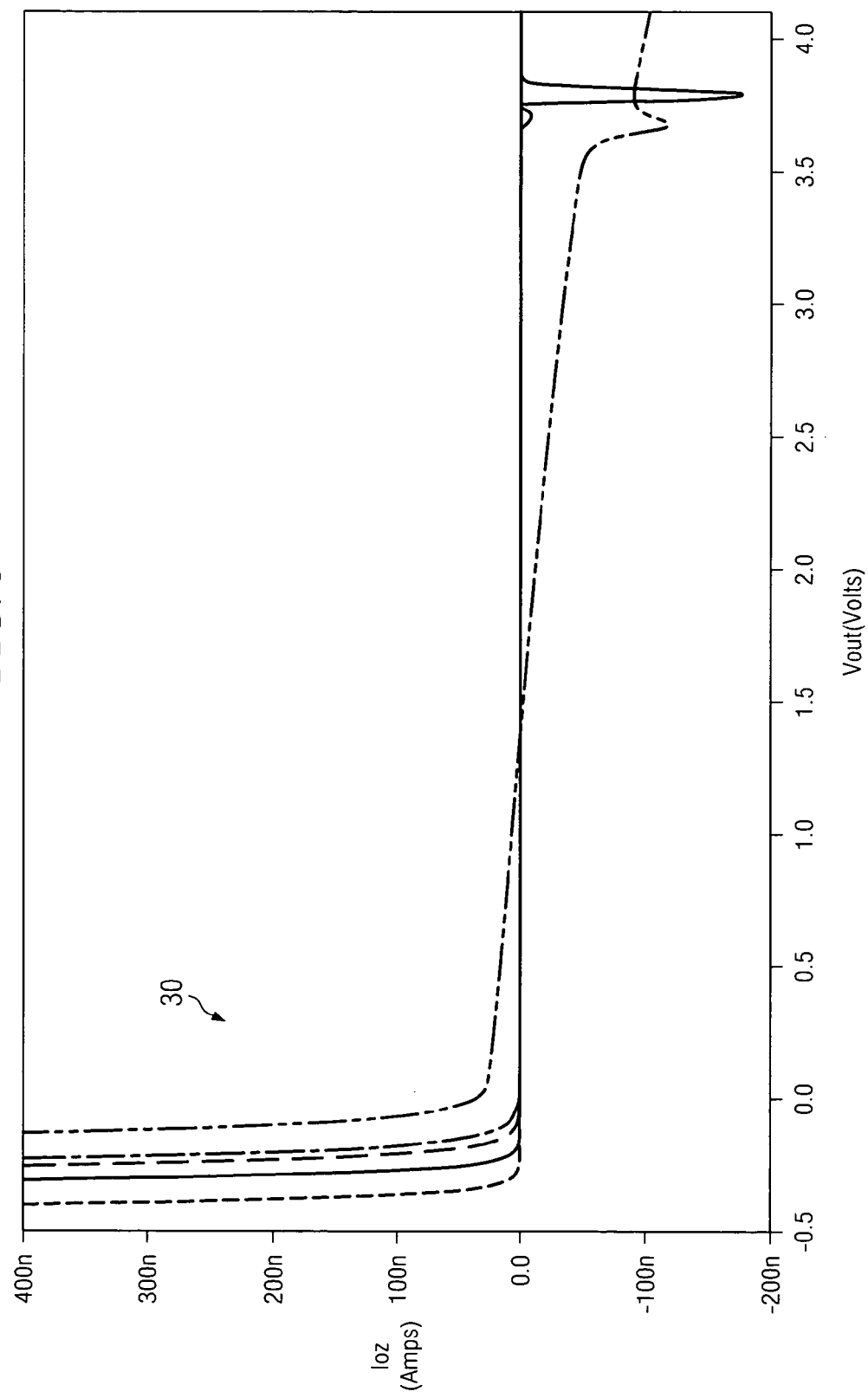
FIG. 3 is a graph depicting typical Ioz plots for the blocking circuit shown in FIG. 1.

FIG. 3 is a graph depicting typical Ioz plots 30 for the blocking circuit 10 shown in FIG. 1. The plots 30 were obtained using a supply voltage, Vcc=3.3V+/−0.3V, while sweeping the output voltage, Vout, from −0.5V to 4.1V. Similar to the Ioff leakage current discussed herein before with reference to FIG. 2, the Ioz leakage current can be seen to also reside in the sub-1 uA range. Blocking circuit 10 therefore provides superior performance over those well-known blocking circuit implementations that employ a Schottky diode in tandom with a PN diode, since those well-known circuit implementations are not capable of holding both leakage currents in the sub-1 uA range.

In view of the above, it can be seen the present invention presents a significant advancement in the art of low power digital logic devices that incorporate Ioff and overvoltage Ioz tolerance. Further, this invention has been described in considerable detail in order to provide those skilled in the Ioff/overvoltage blocking circuit art with the information needed to apply the novel principles and to construct and use such specialized components as are required. In view of the foregoing descriptions, it should further be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. An overvoltage blocking circuit comprising
   a supply voltage node;
   a tri-state output circuit having an output node; and
   a protection circuit coupled to the supply voltage node and the tri-state output circuit and operable to limit current 'Ioz' flowing into the output node to less than 1 micro-Ampere when the tri-state output circuit is in its high impedance state, and further operable to limit the off leakage current 'Ioff' flowing into the output node to less than 1 micro-Ampere when the tri-state output circuit is powered-off.

2. The overvoltage blocking circuit according to claim 1, wherein the protection circuit comprises:
   a diode-connected P-channel transistor; and
   a PN diode connected in parallel with the diode-connected P-channel transistor.

3. The overvoltage blocking circuit according to claim 1, wherein both 'Ioz' and 'Ioff' are typically about 0.2 micro-Amperes.

4. An overvoltage blocking circuit comprising:
   a supply voltage node;
   a tri-state output circuit coupled to the supply node and having an output node; and
   means for limiting high impedance state leakage current 'Ioz' flowing into the output node to less than 1 micro-Ampere when the tri-state output circuit is in its high impedance state, and further for limiting the off leakage current 'Ioff' flowing into the output node to less than 1 micro-Ampere when the tri-state output circuit is powered-off.

5. The overvoltage blocking circuit according to claim 4, wherein the means for limiting 'Ioz' and 'Ioff' comprises:
   a diode-connected P-channel transistor having a first node coupled to the supply voltage node and a second node coupled to the tri-state output circuit; and
   a PN diode connected in parallel with the diode-connected P-channel transistor.

6. The overvoltage blocking circuit according to claim 4, wherein both 'Ioz' and 'Ioff' are typically about 0.2 micro-Amperes.

* * * * *